(12) United States Patent
Liang et al.

(10) Patent No.: US 10,555,441 B2
(45) Date of Patent: Feb. 4, 2020

(54) WINDS SHROUD AND SERVER USING THE SAME

(71) Applicant: Super Micro Computer Inc., San Jose, CA (US)

(72) Inventors: Shih-Hung Liang, San Jose, CA (US); Shao-Yu Su, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 15 days.

(21) Appl. No.: 15/881,720

(22) Filed: Jan. 26, 2018

(65) Prior Publication Data
US 2019/0239393 A1  Aug. 1, 2019

(51) Int. Cl.
*H05K 7/20* (2006.01)
*H05K 7/14* (2006.01)

(52) U.S. Cl.
CPC ....... *H05K 7/20727* (2013.01); *H05K 7/1487* (2013.01); *H05K 7/20145* (2013.01); *H05K 7/20154* (2013.01)

(58) Field of Classification Search
CPC .......... H05K 7/20145; H05K 7/20154; H05K 7/20727; H05K 7/1487; G06F 1/20
USPC ........... 361/679.49–679.51, 695–697
See application file for complete search history.

(56) References Cited

U.S. PATENT DOCUMENTS

| | | | | |
|---|---|---|---|---|
| 5,077,601 A * | 12/1991 | Hatada | ................ | H01L 23/467 165/80.3 |
| 5,563,768 A * | 10/1996 | Perdue | ................ | H01L 23/467 165/80.3 |
| 5,597,035 A * | 1/1997 | Smith | ................ | G06F 1/20 165/147 |
| 6,504,718 B2 * | 1/2003 | Wu | ................ | H05K 7/20727 165/104.33 |
| 7,167,363 B1 * | 1/2007 | Cushman | ............ | H05K 7/1461 361/690 |
| 7,180,740 B2 * | 2/2007 | Li | ................ | H01L 23/467 165/80.3 |
| 7,626,819 B1 * | 12/2009 | Chen | ................ | G06F 1/20 361/694 |
| 8,811,009 B2 * | 8/2014 | Chen | ................ | H05K 7/20145 165/80.1 |
| 8,971,042 B2 * | 3/2015 | Liu | ................ | G06F 1/206 361/679.49 |
| 2004/0240175 A1 * | 12/2004 | Brovald | .............. | G06F 1/20 361/679.5 |
| 2006/0034051 A1 * | 2/2006 | Wang | ................ | H05K 7/20145 361/696 |
| 2007/0236882 A1 * | 10/2007 | Chen | ................ | H05K 7/20154 361/695 |

(Continued)

*Primary Examiner* — Zachary Pape
(74) *Attorney, Agent, or Firm* — Chun-Ming Shih; HDLS IPR Services

(57) ABSTRACT

A wind shroud and a server using the wind shroud is provided. The wind shroud includes a cover and an arc air guide rib. The cover includes an air guide plate, two baffles connected to the air guide plate, two openings, and an air guide passage communicating between the two openings. The arc air guide rib is connected to an inner surface of the air guide plate. Two ends of the arc air guide rib are connected to respective inner surfaces of the two baffles. A length of each baffle is greater than a height of the arc air guide rib. Air flow speed is increased by using the arc air guide rib, so heat dissipation efficiency is improved.

14 Claims, 7 Drawing Sheets

(56) References Cited

U.S. PATENT DOCUMENTS

| | | | | |
|---|---|---|---|---|
| 2008/0205004 A1* | 8/2008 | Ueno | G11B 33/142 | 361/701 |
| 2010/0032139 A1* | 2/2010 | Tian | H01L 23/467 | 165/104.31 |
| 2013/0050942 A1* | 2/2013 | Konishi | H05K 7/20145 | 361/692 |
| 2013/0083481 A1* | 4/2013 | Goto | H05K 7/20209 | 361/695 |
| 2013/0128450 A1* | 5/2013 | Redshaw | F24F 13/068 | 361/679.46 |
| 2013/0148290 A1* | 6/2013 | Chen | G06F 1/20 | 361/679.46 |
| 2013/0301218 A1* | 11/2013 | Li | F04D 33/00 | 361/695 |
| 2014/0293532 A1* | 10/2014 | Schelshorn | H05K 7/20145 | 361/679.53 |
| 2014/0332181 A1* | 11/2014 | Lin | H05K 7/20145 | 165/80.2 |
| 2015/0029659 A1* | 1/2015 | Shao | H05K 7/20145 | 361/679.51 |
| 2016/0135322 A1* | 5/2016 | Chen | G11B 33/142 | 361/679.46 |
| 2018/0042135 A1* | 2/2018 | Tamaki | A63F 13/90 | |

* cited by examiner

WINDS SHROUD AND SERVER USING THE SAME

TECHNICAL FIELD

The present invention relates to a wind shroud and, in particular, a wind shroud and a server using the same, which increases air flow speed and improves heat dissipation efficiency.

BACKGROUND

A server generally consists of a central processing unit (CPU), memory and input/output devices which are connected by buses. In recent years, the server has many electronic components inside to enable high-speed operations. Therefore, if the heat generated by the electronic components is not expelled efficiently, performance of the electronic components will be compromised, and even the lifespan thereof is shortened. It is especially important for storage medium like a hard disk drive (HDD), a solid state drive (SSD), or a solid state hybrid drive (SSHD) to have a good heat dissipation effect.

In order to expel heat and lower the temperature, the server utilizes an active heat dissipation device like a fan or utilizes a passive heat dissipation device like heat dissipation fins. For an enhanced heat dissipation effect, a wind shroud is even disposed corresponding to the electronic components. However, the conventional wind shroud can only guide air flow, but cannot make air flow more concentrated, so the heat dissipation effect is not ideal.

SUMMARY

It is an object of the present invention to provide a wind shroud and a server using the same, by which air flow speed is increased, and heat dissipation efficiency is improved.

Accordingly, the present invention provides a wind shroud and a server using the same. The wind shroud includes a cover and at least one arc air guide rib. The cover includes an air guide plate, two baffles connected to the air guide plate at two sides thereof respectively, two openings at the other two sides of the air guide plate, and an air guide passage communicating between the two openings. Each opening is disposed adjacent to each baffle. The arc air guide rib is connected to an inner surface of the air guide plate, and two ends of the arc air guide rib are connected to respective inner surfaces of the two baffles. A length of each baffle is greater than a height of the arc air guide rib, and the arc air guide rib is arranged along a direction perpendicular to a direction of the air guide passage.

Accordingly, the present invention provides a server including a chassis and the above-mentioned wind shroud. The chassis includes a tray, a heat dissipation fan module disposed on a rear portion of the tray, a motherboard mounted on the tray, and a storage module electrically connected to the motherboard. The heat dissipation fan module includes a plurality of fans which generate a heat transfer airflow toward the storage module. The wind shroud covers the storage module for directing the heat transfer airflow. The arc air guide rib is arranged in a protruding manner and disposed corresponding to the storage module, so that the heat transfer airflow speeds up while passing between the arc air guide rib and the storage module.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Detailed descriptions and technical contents of the present invention are illustrated below in conjunction with the accompanying drawings. However, it is to be understood that the descriptions and the accompanying drawings disclosed herein are merely illustrative and exemplary and not intended to limit the scope of the present invention.

Figure 1:
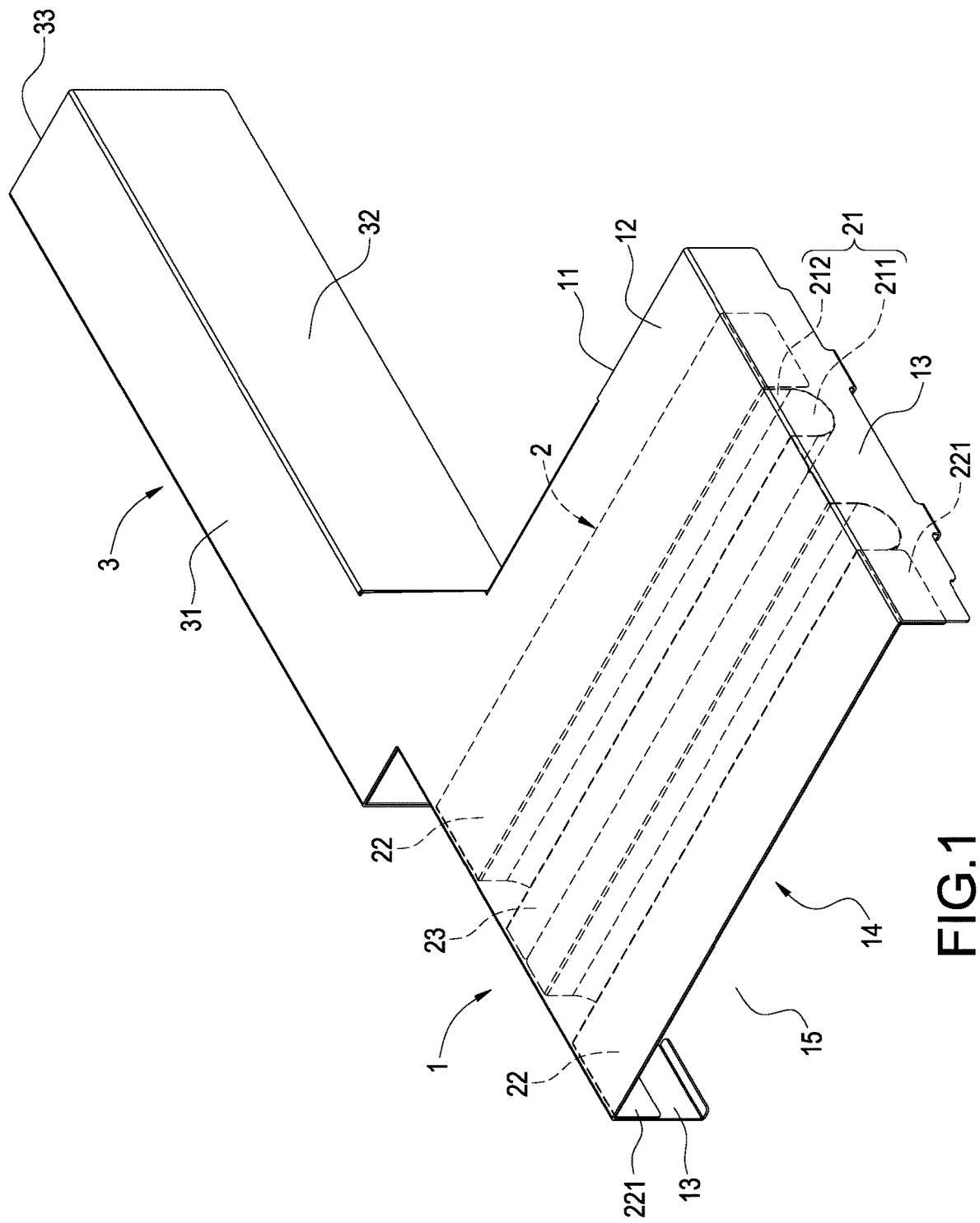
FIG. 1 is a perspective view illustrating a wind shroud and an elongated casing according to the present invention.
Figure 2:
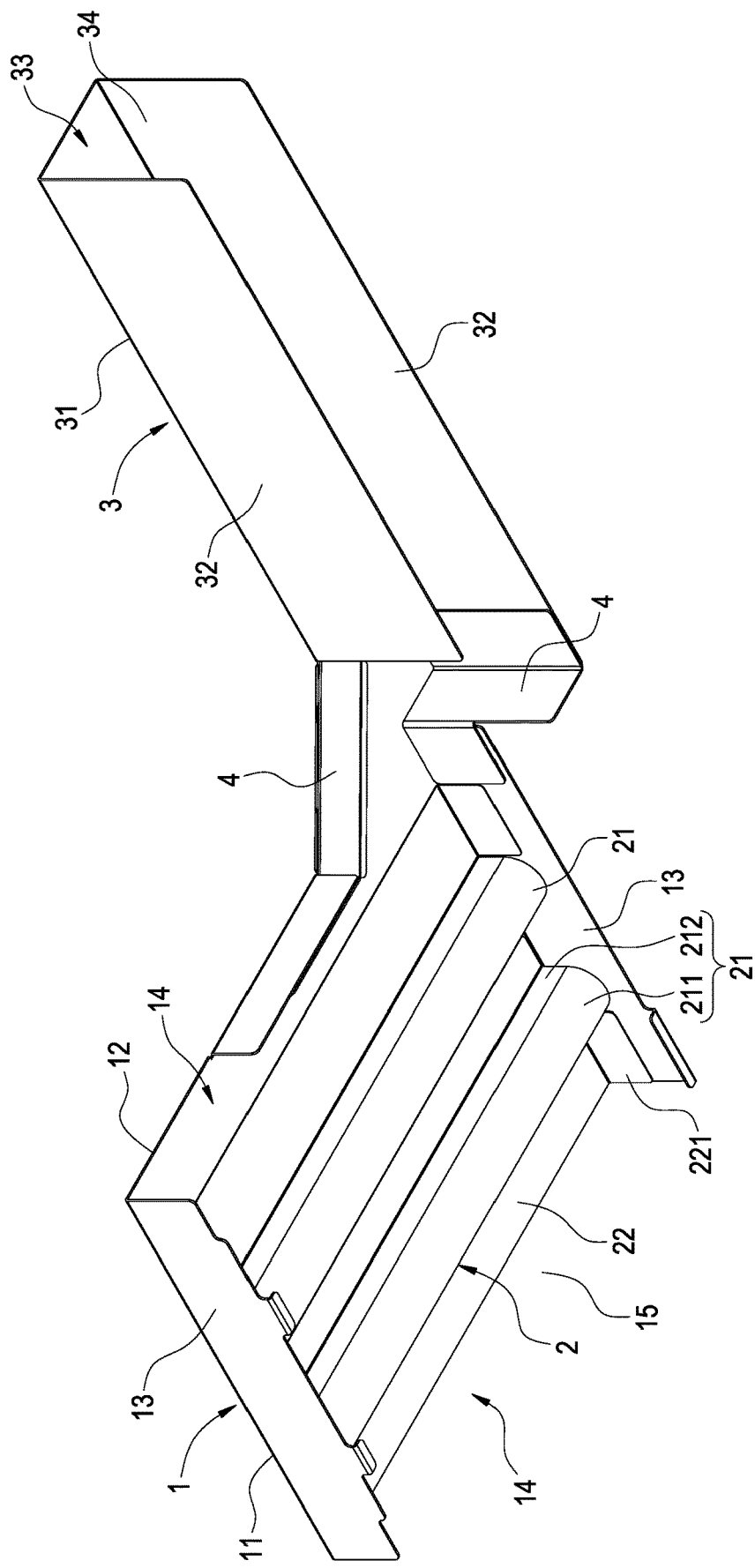
FIG. 2 is another perspective view from a different angle illustrating the wind shroud and the elongated casing.
Figure 3:
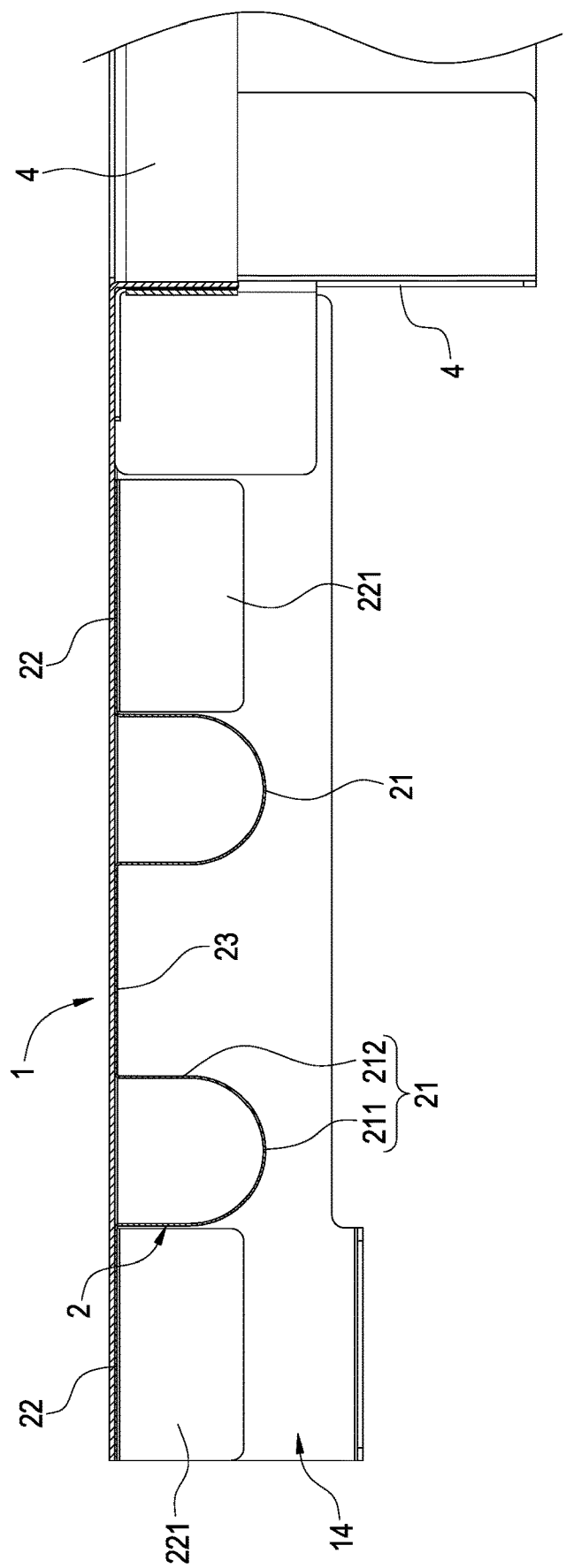
FIG. 3 is a partial cross-sectional view illustrating the wind shroud and the elongated casing.
Figure 4:
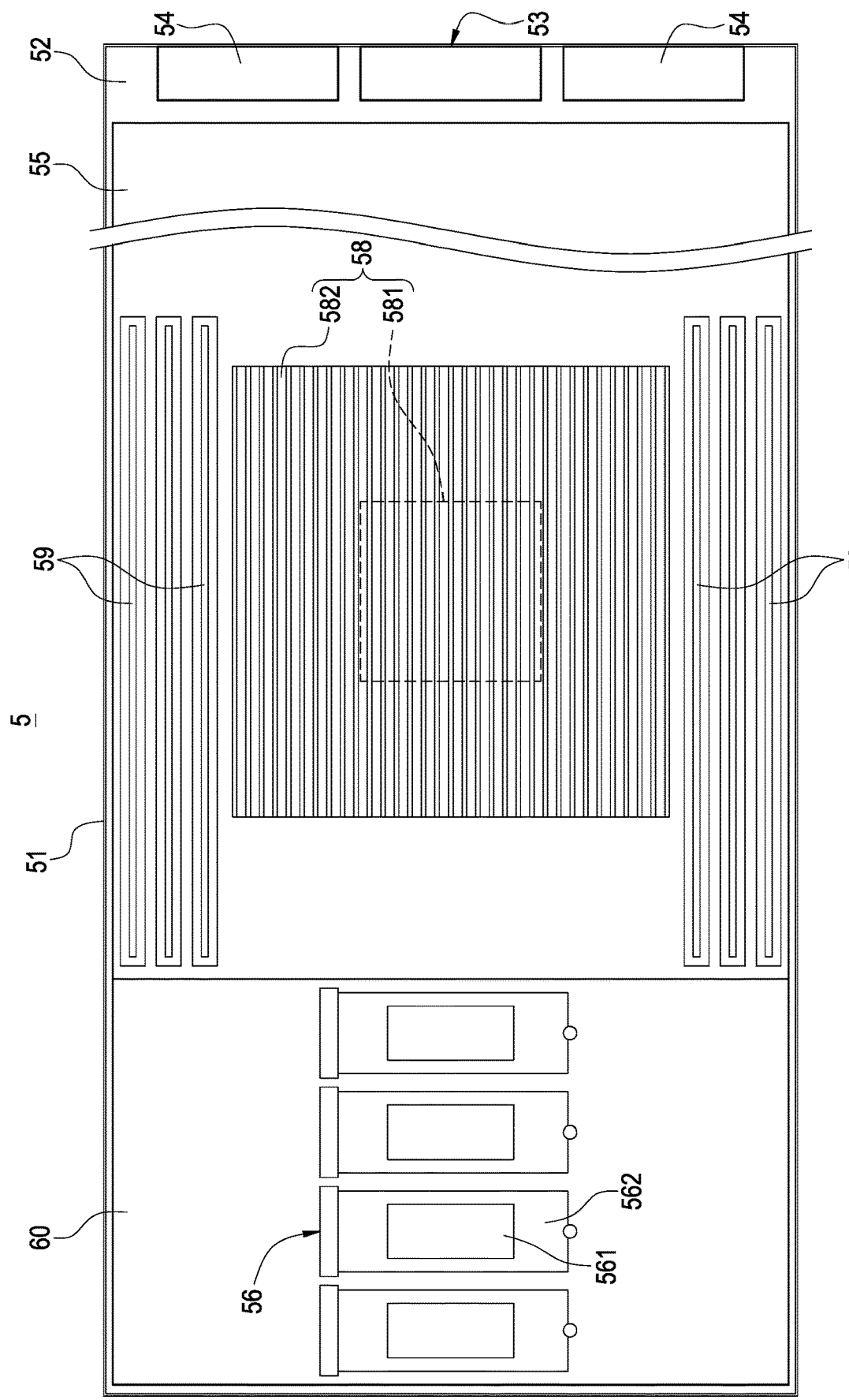
FIG. 4 is a top view illustrating a server according to the present invention.

Referring to FIGS. 1 to 3, the present invention provides a wind shroud 1. The wind shroud 1 includes a cover 11 and at least one arc air guide rib 21. The arc air guide rib 21 preferably consists of an arc portion 211 and two vertical plates 212 connected to two edges of the arc portion 211. However, in alternative embodiments, the arc air guide rib 21 can be formed by the arc portion 211 only. In order to satisfy various design requirements, a height of the arc air guide rib 21 may vary according to a height of each vertical plate 212.

The cover 11 includes an air guide plate 12, two baffles 13 connected to the air guide plate 12 at two sides thereof respectively, two openings 14 at the other two sides of the air guide plate 12, and an air guide passage 15 communicating between the two openings 14. Each opening 14 is disposed adjacent to each baffle 13. In the present embodiment, the wind shroud 1 preferably consists of metal or alloy thereof. However, in alternative embodiments, the wind shroud 1 can consist of plastic, acrylonitrile butadiene styrene (ABS), or the likes. It is preferable that the cover 11 of the wind shroud 1 is of rectangular shape; however, in alternative embodiments, the cover 11 can be of circular shape or other suitable shape according to requirement.

The arc air guide rib 21 is connected to an inner surface of the air guide plate 12, and two ends of the arc air guide rib 21 are connected to respective inner surfaces of the two baffles 13. A length of each baffle 13 is greater than the height of the arc air guide rib 21, and the arc air guide rib 21 is arranged along a direction perpendicular to a direction of the air guide passage 15, so that airflow can flow out along an arc surface of the arc air guide rib 21.

In the embodiment shown in FIGS. 1 to 3, the wind shroud 1 further includes an air guide member 2 which forms the arc air guide rib 21. The air guide member 2 is in contact with the inner surface of the air guide plate 12. However, in alternative embodiments, the arc air guide rib 21 can be integrally formed with the cover 11. The air guide member 2 consists of, but is not limited to, metal or alloy thereof, and the air guide member 2 can even be made of plastic. The air guide member 2 is connected to the air guide plate 12 by welding, screw connection, adhesives, other suitable method, and the present invention is not limited in this regard. The wind shroud 1 has a simple structure and can be easily produced at low cost.

The present embodiment preferably includes multiple arc air guide ribs 21. The arc air guide ribs 21 are arranged in spaced relationship in the air guide member 2, the air guide member 2 includes a plurality of connection plates 23 connected to the arc air guide ribs 21, and at least one attaching plate each connected to one of the leftmost and rightmost arc air guide ribs at one side thereof. The respective attaching plates 22 are disposed on the inner surface of the air guide plate 12, and two wing boards 221 disposed at two ends of each attaching plate 22 are connected to the two baffles 13 respectively. However, in alternative embodiments, if the air guide member 2 includes only one arc air guide rib 21, then the air guide member 2 has two attaching plates 22 connected to the arc air guide rib 21 at two sides thereof, and each attaching plate 22 has two wing boards 221 at two ends to be fixed to the cover 11.

Referring to FIGS. 1 to 3, the wind shroud 1 further includes an elongated casing 3 connected to the cover 11 at one side of the opening 15 of the cover 11. The elongated casing 3 includes an elongated plate 31, two lateral baffle plates 32 connected to the elongated plate 31 at two sides thereof, two holes 33 formed at the other two sides of the elongated plate 31, and an elongated air guide channel 34 communicating between the two holes 33. The elongated plate 31 is connected and parallel to the air guide plate 12, and the two lateral baffle plates 32 are connected to the two baffles 13 respectively, so that the elongated air guide channel 34 communicates with the air guide passage 15, and the airflow is thereby directed into the cover 11 without being obstructed, and thus a reduction of wind speed is avoided, heat dissipation efficiency is increased.

As shown in the drawings, the wind shroud 1 further includes two connection baffle plates 4, and each connection baffle plate 4 is connected to the cover 11 and the elongated casing 3, so that air flow is prevented from leaking through gaps (not illustrated) between the cover 11 and the elongated casing 3. To be specific, each connection baffle plate 4 is connected to the corresponding baffle 13 and the corresponding lateral baffle plate 32, and the connection baffle plates 4 can be designed with different heights to connect the baffles 13 and the lateral baffle plates 32.

Please refer to FIGS. 4 to 7, illustrating a server 5 using the wind shroud 1. In the drawings, the server 5 includes a chassis 51 and the wind shroud 1 of the above-mentioned embodiment. The chassis 51 includes a tray 52, a heat dissipation fan module 53 on a rear portion of the tray 52, a motherboard 55 mounted on the tray 52, and a storage module 56 electrically connected to the motherboard 55. The heat dissipation fan module 53 has a plurality of fans 54 which generates a heat transfer airflow 57 toward the storage module 56. The wind shroud 1 covers the storage module 56 to direct the heat transfer airflow 57 into the wind shroud 1.

The motherboard 55 includes a heat module 58 and a plurality of slots 59 disposed at two sides of the heat module 58 and is electrically connected to the heat module 58 and the slots 59. In the embodiment shown in FIGS. 4 and 5, the heat module 58 includes a heat element 581 like a chip and includes a heat sink base 582 disposed on a surface of the heat element 581. As shown in the drawings, the heat sink base 582 has a plurality of fins (not labelled) which are preferably arranged in a direction parallel to a direction of the heat transfer airflow 57, thus facilitating dissipating the heat from the heat element 581 to the outside of the chassis 51. Each slot 59 is provided for insertion of a memory card (not labelled) or other suitable card. The slots 59 are disposed at two sides of the motherboard 55 and are also arranged in a direction parallel to that of the heat transfer airflow 57, and thus the heat transfer airflow 57 can be smoothly directed into the wind shroud 1.

Figure 6:
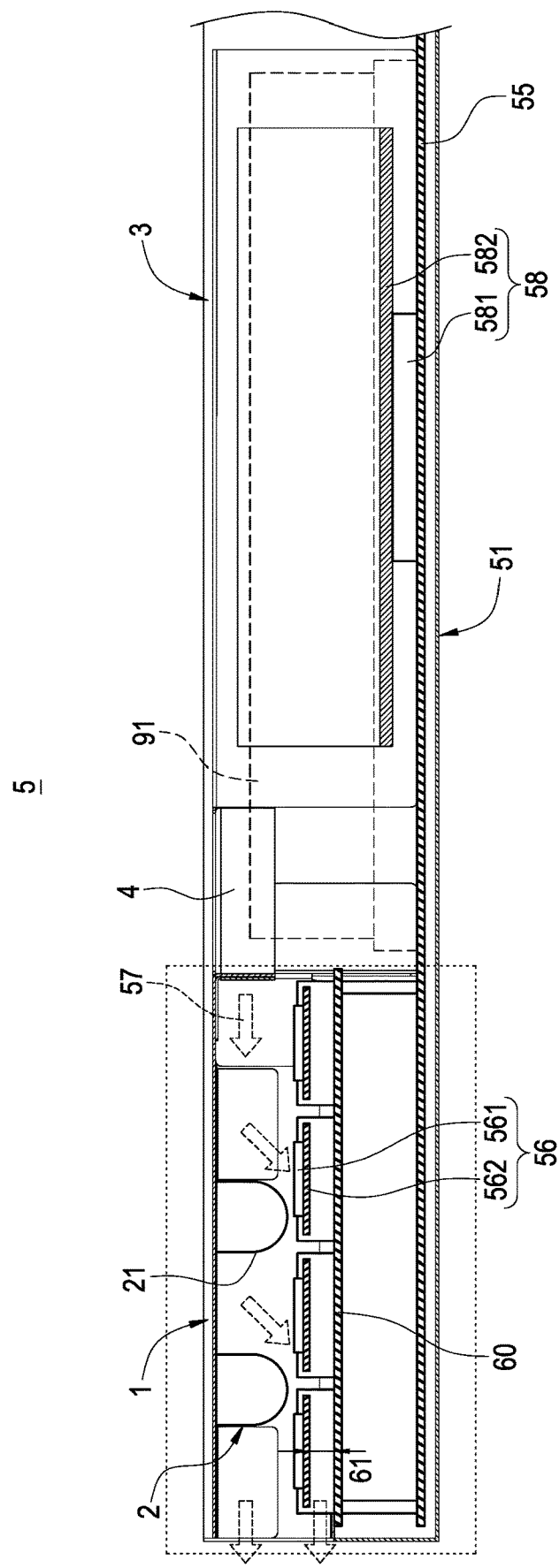
FIG. 6 is a partial cross-sectional view illustrating the wind shroud and the server using the same.
Figure 7:
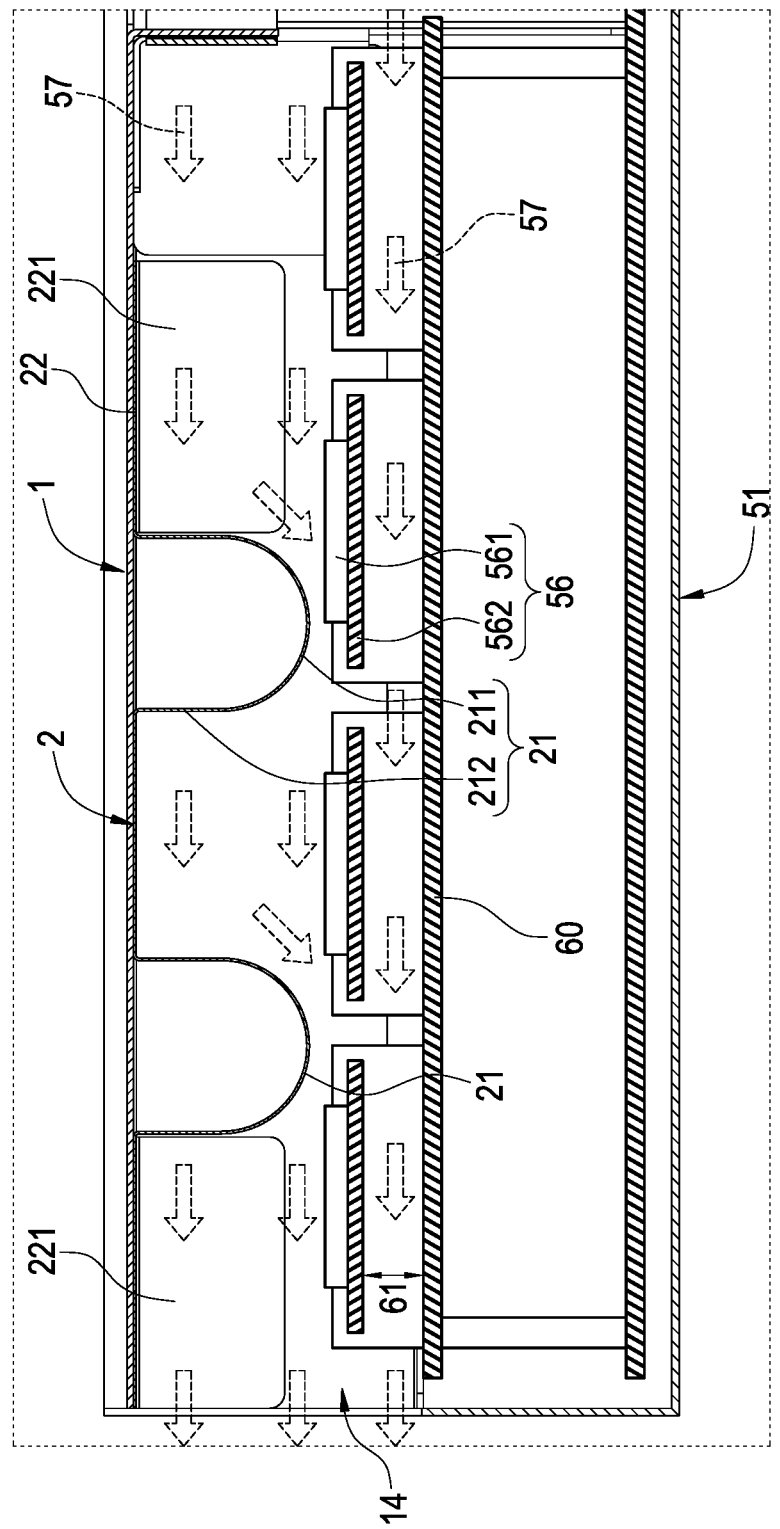
FIG. 7 is a partial enlarged view of FIG. 6.

In the present embodiment, the server 5 includes multiple storage modules, and a subsidiary circuit board 60 is electrically coupled to each storage module 56. The subsidiary circuit board 60 is disposed corresponding to a front portion of the tray 52. As shown in FIGS. 6 and 7, the subsidiary circuit board 60 is electrically coupled to and disposed over the motherboard 55. Each storage module 56 preferably consists of a solid state drive (SSD). The storage module 56 further includes a flash memory 561 and a circuit board 562. The circuit board 562 is electrically coupled to the subsidiary circuit board 60. An air gap 61 is formed between the circuit board 562 and the subsidiary circuit board 60, and the air gap 61 allows the heat transfer airflow 57 to pass through, so that the heat transfer airflow 57 flows by upper and lower surfaces of each flash memory 561, thereby enhancing heat dissipation efficiency of the storage module 56. In alternative embodiments, each storage module 56 can consist of a hard disk drive (HDD), a solid state hybrid drive (SSHD) or other component as needed.

The structure of the wind shroud 1 is detailed in the foregoing embodiment, so a description thereof is omitted herein for brevity. Nevertheless, it should be noted that, the elongated casing 1 connected to the cover 1 preferably covers the slots 59 arranged at one side, and the elongated air guide channel 34 communicates with the air guide passage 15. Therefore, the heat transfer airflow 57 generated by the fans 54 of the heat dissipation fan module 53 can be properly directed into the wind shroud 1 by means of the elongated air guide channel 34, and this configuration prevents other components in the chassis 51 from hindering the heat transfer airflow 57 and reducing the heat dissipation efficiency.

Figure 5:
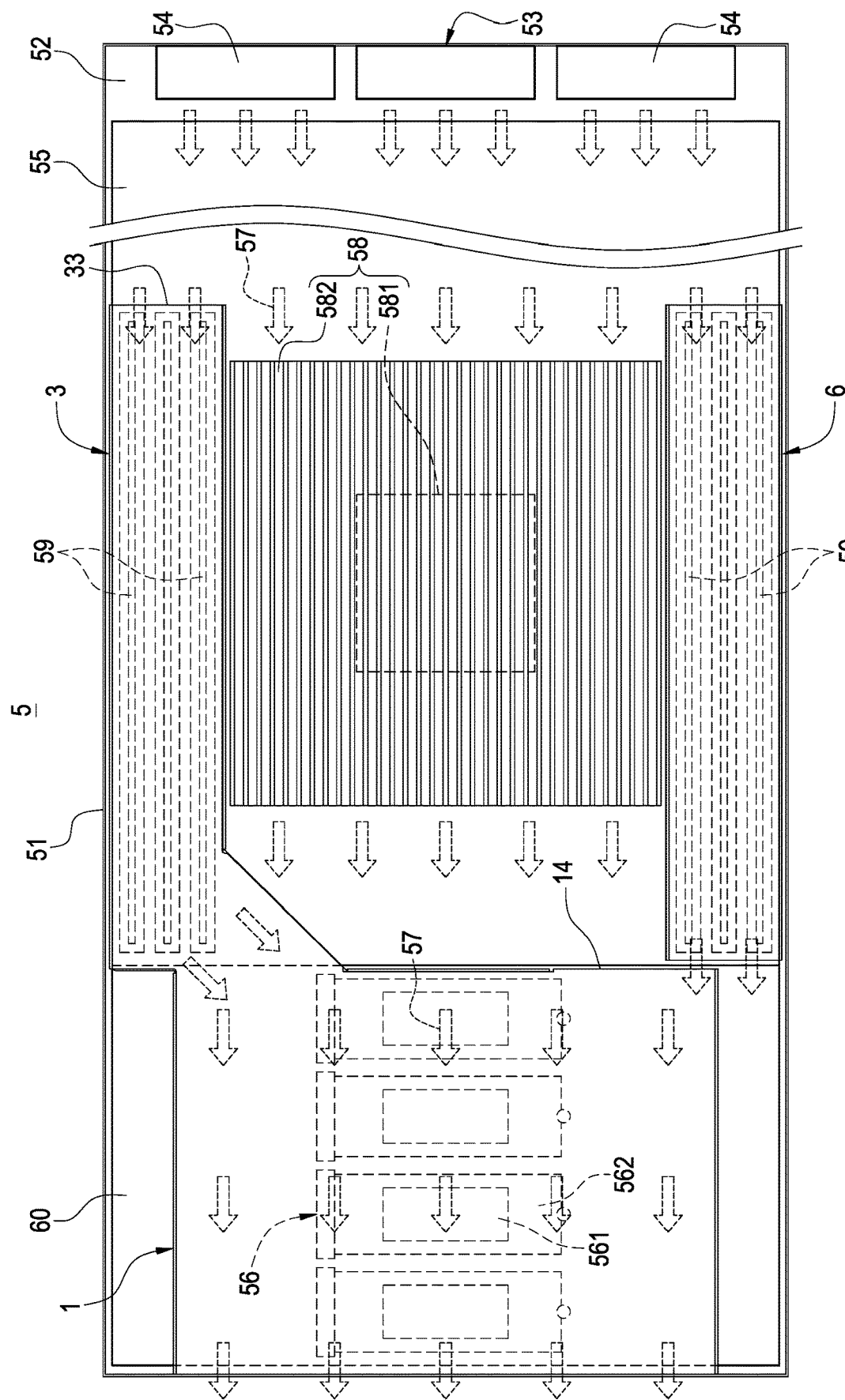
FIG. 5 is a schematic view illustrating the wind shroud and the server using the same.

In the embodiment shown in FIG. 5, the server 5 further includes an auxiliary casing 6 disposed in a symmetrical manner with respect to the elongated casing 3. The auxiliary casing 6 has a similar structure as that of the elongated casing 3, and the auxiliary casing 6 covers the slots 59 arranged at the other side, so that the heat transfer airflow 57 can be directed into the storage module 56 at the front portion of the tray 52 to thereby increase the heat dissipation efficiency of the storage module 56.

The arc air guide ribs 21 is arranged in a protruding manner and disposed corresponding to the storage module 561. The heat transfer airflow 57 speeds up as it passes through a gap (not labelled) between the arc air guide rib and the upper surface of the flash memory 561, so that the heat transfer airflow 57 is guided to flow out of the chassis 51 from the opening 14 of the cover 11, and the heat generated by the storage module 56 can be expelled rapidly to increase the heat dissipation efficiency. Furthermore, since the heat transfer airflow 57 also passes through the air gap 61 in the storage module 56, the heat is efficiently expelled and the lifespan of the components is prolonged.

What is claimed is:
1. A wind shroud, comprising:
a cover, the cover including an air guide plate, two baffles connected to the air guide plate at two sides thereof respectively, two openings at the other two sides of the air guide plate, and an air guide passage communicat- ing between the two openings, wherein each opening is disposed adjacent to each baffle;
an arc air guide rib connected to an inner surface of the air guide plate, two ends of the arc air guide rib being connected to respective inner surfaces of the two baffles, wherein a length of each baffle is greater than a height of the arc air guide rib, and the arc air guide rib is arranged along a direction perpendicular to a direction of the air guide passage; and
an air guide member which forms the arc air guide rib, the air guide member being in contact with the inner surface of the air guide plate;
wherein the air guide member includes two attaching plates connected to the arc air guide rib at two sides thereof, and two wing boards are disposed at two ends of each of the attaching plates to connect the two baffles respectively.

2. The wind shroud according to claim 1, wherein the arc air guide rib consists of an arc portion and two vertical plates connected to two edges of the arc portion.

3. The wind shroud according to claim 1, further comprising an elongated casing connected to the cover at one side of the opening of the cover, the elongated casing including an elongated plate, two lateral baffle plates connected to the elongated plate at two sides thereof, two holes formed at the other two sides of the elongated plate, and an elongated air guide channel communicating between the two holes.

4. The wind shroud according to claim 3, wherein the elongated plate is coupled and parallel to the air guide plate, and the two lateral baffle plates are coupled to the two baffles respectively, so that the elongated air guide channel communicates with the air guide passage.

5. The wind shroud according to claim 3, further comprising two connection baffle plates, each connection baffle plate being connected to the cover and the elongated casing, each connection baffle plate being connected to the corresponding baffle and the corresponding lateral baffle plate.

6. A server, comprising:
a chassis, the chassis including a tray, a heat dissipation fan module disposed on a rear portion of the tray, a motherboard mounted on the tray, and a storage module electrically connected to the motherboard, wherein the heat dissipation fan module includes a plurality of fans which generate a heat transfer airflow toward the storage module; and
a wind shroud covering the storage module for directing the heat transfer airflow, the wind shroud comprising:
a cover, the cover including an air guide plate, two baffles connected to the air guide plate at two sides thereof respectively, two openings at the other two sides of the air guide plate, and an air guide passage communicating between the two openings, wherein each opening is disposed adjacent to each baffle; and
an arc air guide rib connected to an inner surface of the air guide plate, two ends of the arc air guide rib being connected to respective inner surfaces of the two baffles, wherein a length of each baffle is greater than a height of the arc air guide rib, and the arc air guide rib is arranged in a protruding manner and disposed corresponding to the storage module, so that the heat transfer airflow speeds up while passing between the arc air guide rib and the storage module,
wherein the arc air guide rib is arranged along a direction perpendicular to a direction of the air guide passage;
wherein the arc air guide rib consists of an arc portion and two vertical plates connected to two edges of the arc portion.

7. The server according to claim 6, wherein the motherboard includes a heat module and a plurality of slots disposed at two sides of the heat module, and the motherboard is electrically connected to the heat module and the slots.

8. The server according to claim 7, further comprising an elongated casing connected to the cover at one side of the opening of the cover to communicate with the opening, the elongated casing covering the slots arranged at one side, the elongated casing including an elongated plate, two lateral baffle plates connected to the elongated plate at two sides thereof, two holes formed at the other two sides of the elongated plate, and an elongated air guide channel communicating between the two holes.

9. The server according to claim 6, further comprising a subsidiary circuit board electrically coupled to the storage module, the subsidiary circuit board being electrically coupled to and disposed over the motherboard.

10. The server according to claim 9, wherein the storage module includes a flash memory and a circuit board electrically connected to the flash memory, and the circuit board is electrically connected to the subsidiary circuit board.

11. The server according to claim 10, wherein an air gap is formed between the circuit board and the subsidiary circuit board, and the air gap allows the heat transfer airflow to pass through.

12. The server according to claim 6, further comprising an air guide member which forms the arc air guide rib, the air guide member being in contact with the inner surface of the air guide plate.

13. The server according to claim 12, wherein the air guide member includes two attaching plates connected to the arc air guide rib at two sides thereof, and two wing boards are disposed at two ends of each of the attaching plates to connect the two baffles respectively.

14. A server, comprising:
a chassis, the chassis including a tray, a heat dissipation fan module disposed on a rear portion of the tray, a motherboard mounted on the tray, and a storage module electrically connected to the motherboard, wherein the heat dissipation fan module includes a plurality of fans which generate a heat transfer airflow toward the storage module;
a wind shroud covering the storage module for directing the heat transfer airflow, the wind shroud comprising:
a cover, the cover including an air guide plate, two baffles connected to the air guide plate at two sides thereof respectively, two openings at the other two sides of the air guide plate, and an air guide passage communicating between the two openings, wherein each opening is disposed adjacent to each baffle; and
an arc air guide rib connected to an inner surface of the air guide plate, two ends of the arc air guide rib being connected to respective inner surfaces of the two baffles, wherein a length of each baffle is greater than a height of the arc air guide rib, and the arc air guide rib is arranged in a protruding manner and disposed corresponding to the storage module, so that the heat transfer airflow speeds up while passing between the arc air guide rib and the storage module,
wherein the arc air guide rib is arranged along a direction perpendicular to a direction of the air guide passage;
wherein the motherboard includes a heat module and a plurality of slots disposed at two sides of the heat module, and the motherboard is electrically connected to the heat module and the slots;

an elongated casing connected to the cover at one side of the opening of the cover to communicate with the opening, the elongated casing covering the slots arranged at one side; and an auxiliary casing disposed in a symmetrical manner with respect to the elongated casing, the auxiliary casing covering the slots arranged at one side.

* * * * *